United States Patent
Jin et al.

(10) Patent No.: US 12,364,107 B2
(45) Date of Patent: Jul. 15, 2025

(54) DISPLAY PANEL AND DISPLAY DEVICE WITH CATHODE SUPPRESSION LAYER IN A SPACER

(71) Applicant: WUHAN CHINA STAR OPTOELECTRONICS SEMICONDUCTOR DISPLAY TECHNOLOGY CO., LTD., Wuhan (CN)

(72) Inventors: Meng Jin, Wuhan (CN); Lei Lv, Wuhan (CN); Tao Yuan, Wuhan (CN); Jinchang Huang, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 783 days.

(21) Appl. No.: 17/600,477

(22) PCT Filed: Aug. 4, 2021

(86) PCT No.: PCT/CN2021/110550
§ 371 (c)(1),
(2) Date: Sep. 30, 2021

(87) PCT Pub. No.: WO2023/000388
PCT Pub. Date: Jan. 26, 2023

(65) Prior Publication Data
US 2023/0209902 A1    Jun. 29, 2023

(30) Foreign Application Priority Data
Jul. 19, 2021 (CN) .......................... 202110813062.4

(51) Int. Cl.
*H10K 59/122* (2023.01)
*H10K 59/35* (2023.01)

(52) U.S. Cl.
CPC ......... *H10K 59/122* (2023.02); *H10K 59/352* (2023.02); *H10K 59/353* (2023.02)

(58) Field of Classification Search
CPC .................................................. H10K 59/353
See application file for complete search history.

(56) References Cited

U.S. PATENT DOCUMENTS

| 2018/0013092 A1* | 1/2018 | Park | H10K 77/111 |
| 2018/0138450 A1* | 5/2018 | Park | H10K 50/828 |

(Continued)

FOREIGN PATENT DOCUMENTS

| CN | 107331791 A | 11/2017 |
| CN | 109638051 A | 4/2019 |

(Continued)

*Primary Examiner* — Peter Bradford
(74) *Attorney, Agent, or Firm* — The Roy Gross Law Firm, LLC; Roy D. Gross

(57) ABSTRACT

A display panel and a display device are provided. The display panel having a first display region includes a base, a pixel definition layer, and first spacers. At least one of the first spacers is provided with a via hole, and a first cathode suppression layer is disposed in the via hole. The first cathode suppression layer causes no cathode layer deposited in the via holes of the first spacers. In this way, the light transmittance of each of the first spacers in the first display region is increased, thereby increasing the light transmittance of the first display region.

16 Claims, 7 Drawing Sheets

(56) References Cited

U.S. PATENT DOCUMENTS

| | | | |
|---|---|---|---|
| 2018/0158886 A1* | 6/2018 | Dong | H10K 50/813 |
| 2020/0144342 A1* | 5/2020 | Shim | H10K 50/81 |
| 2020/0395422 A1* | 12/2020 | Xu | H10K 71/00 |
| 2021/0408181 A1* | 12/2021 | Luo | H10K 59/122 |
| 2022/0310721 A1* | 9/2022 | Ma | H10K 50/8428 |
| 2023/0263010 A1* | 8/2023 | Lv | H10K 71/16 |
| | | | 257/40 |

FOREIGN PATENT DOCUMENTS

| | | | | |
|---|---|---|---|---|
| CN | 110047898 A | | 7/2019 | |
| CN | 110265447 A | | 9/2019 | |
| CN | 110783381 A | | 2/2020 | |
| CN | 110783483 A | | 2/2020 | |
| CN | 110993661 A | | 4/2020 | |
| CN | 111584591 A | | 8/2020 | |
| CN | 111883687 A | | 11/2020 | |
| CN | 112054048 A | | 12/2020 | |
| CN | 112103318 A | | 12/2020 | |
| CN | 112216731 A | * | 1/2021 | ........... G06F 3/0412 |
| CN | 113054133 A | | 6/2021 | |
| CN | 113054134 A | | 6/2021 | |
| CN | 113113456 A | | 7/2021 | |
| JP | 2012198991 A | * | 10/2012 | |
| KR | 20150047697 A | | 5/2015 | |

\* cited by examiner

DISPLAY PANEL AND DISPLAY DEVICE WITH CATHODE SUPPRESSION LAYER IN A SPACER

CROSS REFERENCE TO RELATED APPLICATIONS

This application is a National Phase of PCT Patent Application No. PCT/CN2021/110550 having International filing date of Aug. 4, 2021, which claims the benefit of priority of Chinese Application No. 202110813062.4 filed on Jul. 19, 2021. The contents of the above applications are all incorporated by reference as if fully set forth herein in their entirety.

FIELD OF INVENTION

The present disclosure relates to the field of display technologies, and more particularly, to a display panel and a display device.

BACKGROUND OF INVENTION

Organic light emitting diode (OLED) display technology has received more and more attention from scientific researchers and has been widely used in display fields such as mobile phones, flat panel computers, and televisions. However, with the rapid development of display devices, the requirement for the screen-to-body ratio of display devices from users is getting higher, such that a full-screen display device with large-size and high-resolution becomes the direction of the future development.

Technical Problems

In a prior art, in order to increase the screen-to-body ratio as much as possible, optical elements such as a front camera and facial recognition devices are usually disposed under the screen. However, in an existing OLED full-screen display equipment, a cathode formed by a full surface evaporation process is used. Due to the low light transmittance of the cathode to visible light and near-infrared light, the optical elements such as cameras and facial recognition devices disposed under the screen cannot receive sufficient light signals, thereby affecting normal operation of the optical elements.

In summary, the existing display panel has a problem of insufficient light transmittance in the region of the display panel corresponding to the optical elements. Therefore, it is necessary to provide a display panel and a display device to improve this defect.

SUMMARY OF INVENTION

Technical Solutions

The embodiments of the present application provide a display panel and a display device to solve the problem of insufficient light transmittance in the region of the display panel corresponding to the optical elements in the existing display panel.

The embodiments of the present application provide a display panel, and the display panel having a first display region includes:
 a base;
 a pixel definition layer disposed on a side of the base; and
 a plurality of first spacers arranged in the first display region at intervals, and disposed on a side of the pixel definition layer away from the base;
 wherein at least one of the first spacers is provided with a via hole, and a first cathode suppression layer made of a light-transmitting material is disposed in the via hole.

According to one embodiment of the present application, the via hole penetrates at least the first spacer where the via hole located, in a thickness direction of the display panel.

According to one embodiment of the present application, the via hole penetrates the first spacer where the via hole located and the pixel definition layer.

According to one embodiment of the present application, a filling layer made of a light-transmitting material is further disposed in the via hole, and the filling layer is disposed on a side of the first cathode suppression layer away from the base.

According to one embodiment of the present application, a surface of the filling layer away from the base is flush with a surface of the first spacer away from the base.

According to one embodiment of the present application, a filling layer made of a light-transmitting material is further disposed in the via hole, and the filling layer is disposed on a side of the first cathode suppression layer close to the base.

According to one embodiment of the present application, a surface of the first cathode suppression layer away from the base is flush with a surface of the first spacer away from the base.

According to one embodiment of the present application, on a plane where a surface of the at least one of the first spacers away from the base is located, a ratio of an opening area of the via hole to an area of an end of the first spacer away from the base is greater than or equal to 0.5 and less than or equal to 0.9.

According to one embodiment of the present application, the display panel further includes a second display region, and a plurality of second spacers arranged in the second display region at intervals, wherein each of the second spacers and each of the first spacers are disposed on the same side of the pixel definition layer;
 wherein an area of an end of the first spacer away from the base is greater than an area of an end of the second spacer away from the base.

According to one embodiment of the present application, a ratio of an area of the end of the second spacer away from the base to an area of the end of the first spacer away from the base is greater than or equal to 0.14 and less than or equal to 0.25.

According to one embodiment of the present application, a plurality of sub-pixel units are disposed in the first display region in array, the at least one of the first spacers is arranged between the plurality of sub-pixel units, each of the sub-pixel units comprises an anode, and the anode is disposed on a side of the pixel definition layer close to the base;
 wherein a minimum distance between an orthographic projection of the via hole projected on the base and an orthographic projection of the anode adjacent to the via hole projected on the base is greater or equal to 2 micrometers and less than or equal to 5 micrometers.

According to one embodiment of the present application, the display panel further includes a plurality of second cathode suppression layers, wherein the plurality of second cathode suppression layers are disposed on a portion of the pixel definition layer corresponding to the first display region, and are located between the plurality of sub-pixel units;

wherein an orthographic projection of the first cathode suppression layer projected on the base is separated from an orthographic projection of the second cathode suppression layers projected on the base.

According to one embodiment of the present application, the orthographic projection of the first cathode suppression layer projected on the base and the orthographic projection of the second cathode suppression layers projected on the base are both separated from the orthographic projection of the anode projected on the base.

According to one embodiment of the present application, the display panel further includes a cathode layer disposed on the side of the pixel definition layer away from the base, wherein a thickness of the first cathode suppression layer and a thickness of the second cathode suppression layers are both less than or equal to a thickness of the cathode layer.

The embodiment of the present application further provides a display device including a display panel, the display panel having a first display region, and the display panel includes:

a base;

a pixel definition layer disposed on a side of the base; and a plurality of first spacers arranged in the first display region at intervals, and disposed on a side of the pixel definition layer away from the base;

wherein at least one of the first spacers is provided with a via hole, and a first cathode suppression layer made of a light-transmitting material is disposed in the via hole.

According to one embodiment of the present application, the via hole penetrates at least the first spacer where the via hole located, in a thickness direction of the display panel.

According to one embodiment of the present application, the via hole penetrates the first spacer where the via hole located and the pixel definition layer.

According to one embodiment of the present application, a filling layer made of a light-transmitting material is further disposed in the via hole, and the filling layer is disposed on a side of the first cathode suppression layer away from the base.

According to one embodiment of the present application, a surface of the filling layer away from the base is flush with a surface of the first spacer away from the base.

According to one embodiment of the present application, a filling layer made of a light-transmitting material is further disposed in the via hole, and the filling layer is disposed on a side of the first cathode suppression layer close to the base.

Beneficial Effect:

The embodiments of the present application provide a display panel and a display device. The display panel having a first display region and a second display region, and the display panel includes a base, a pixel definition layer, and a plurality of first spacers. The pixel definition layer is disposed on a side of the base. The plurality of first spacers are arranged in the first display region at intervals, and are disposed on a side of the pixel definition layer away from the base. At least one of the first spacers is provided with a via hole, and an opening of the via hole faces a side of the first spacer away from the base. A first cathode suppression layer made of a light-transmitting material is disposed in the via hole. When a cathode layer is formed by a full surface evaporation process, the first cathode suppression layer can cause that no cathode layer is deposited in the via hole of the first spacer. In this way, the light transmittance of the first spacer in the first display region is increased, and the light transmittance of the first display region is increased.

DESCRIPTION OF DRAWINGS

In order to describe the technical solutions more clearly in the embodiments of the present application, the following will briefly introduce the drawings needed in the description of the embodiments. Obviously, the drawings in the following description are only some embodiments of the present application. For those skilled in the art, without creative work, other drawings can be obtained based on these drawings.

DETAILED DESCRIPTION OF PREFERRED EMBODIMENTS

Figure 1:
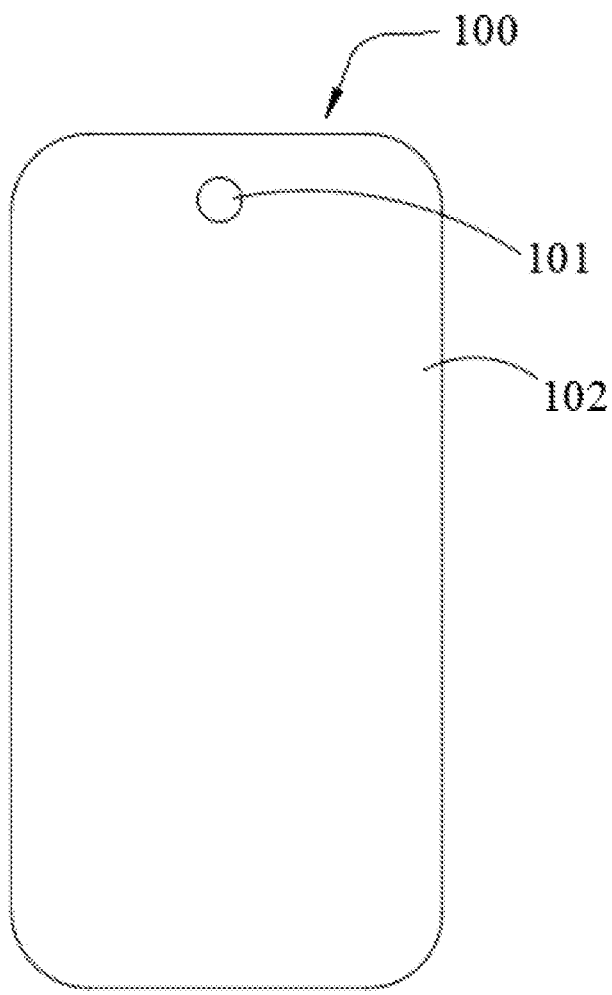
FIG. 1 is a schematic planar structural diagram of a display panel provided by an embodiment of the present application.

The description of the following embodiments refers to the attached drawings to illustrate specific embodiments that the present disclosure can be implemented. The directional terms mentioned in this disclosure, such as [top], [bottom], [front], [back], [left], [right], [inside], [outside], [side], only refer to the direction of the attached drawings. The directional terms used herein are used to explain and illustrate the application, not to limit the protection scope of the application. In the drawings, components with the same structure are denoted by the same numerals.

The following describes the preferred embodiments of the application in detail with reference to the accompanying drawings in the specification.

The embodiment of the present application provides a display panel 100, as shown in FIG. 1. FIG. 1 is a schematic planar structural diagram of a display panel provided by an embodiment of the present application. The display panel 100 includes a first display region 101 and a second display region 102. The shape of the first display region 101 on the plane where the display panel 100 is located is circular, and the second display region 102 is arranged around the first display region 101.

In practical applications, the shape of the first display region 101 is not limited to the circular mentioned above, and the shape may also be oval, drop-shaped, or other irregular shapes. The first display region 101 may be arranged at any position on the display panel 100.

It should be noted that the first display region 101 is a function additional region, and the second display region 102 is a main display region for displaying screen images. The display region 101 may be used to display screen images and seamlessly be connected to the screen images displayed on the second display region, so that the display panel can present a full-screen displaying effect. Moreover, the display region 101 may also be used as a channel providing external light for optical elements such as cameras and facial recognition devices disposed under the display panel 100, so that the display panel 100 can have an under-screen camera and realize facial recognition, thereby improving user experience.

In one embodiment, a light transmittance of the first display region 101 is greater than a light transmittance of the second display region 102. It can be understood that the light transmittance of the first display region 101 is related to the film layer structure of the display panel 100 corresponding to the first display region 101. The greater the light transmittance of the first display region 101 is, the more ambient light the optical element can obtain, and the better the operating effect of the optical element is. If the optical element is a camera, the higher light transmittance the first display region 101 has, the better the imaging effect of the camera is.

Figure 2:
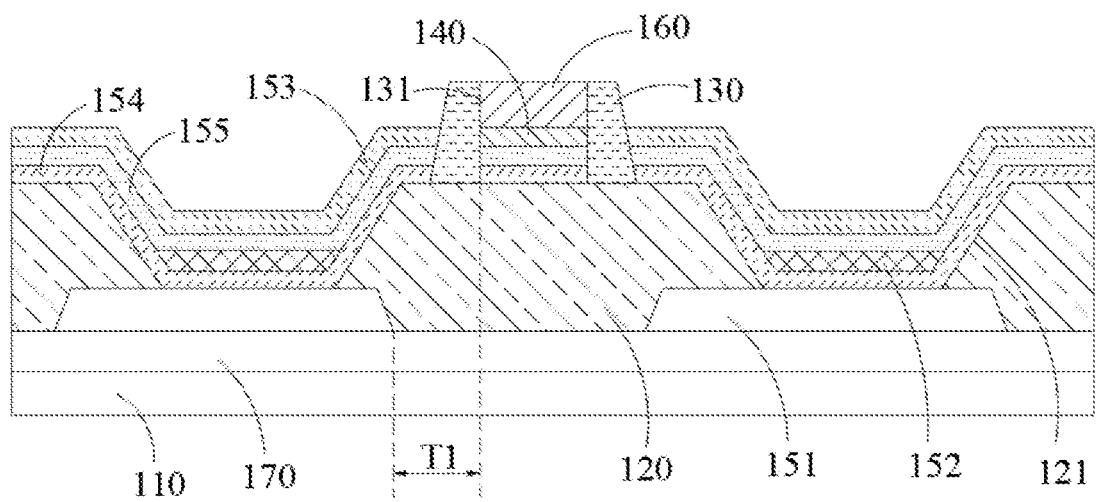
FIG. 2 is a schematic structural diagram of a first type of the display panel provided by an embodiment of the present application.

In one embodiment, as shown in FIG. 2, which is a schematic structural diagram of a first type of the display panel provided by an embodiment of the present application, the display panel 100 includes a base 110, a pixel definition layer 120, and a plurality of first spacers 130. The pixel definition layer 120 is disposed on a side of the base 120. The plurality of first spacers 130 are arranged in the first display region 101 at intervals and are disposed on a side of the pixel definition layer 120 away from the base 110.

At least one of the first spacers 130 is provided with a via hole 131, and an opening of the via hole 131 faces a side of the first spacer 130 away from the base 110. A first cathode suppression layer 140 made of a light-transmitting material is disposed in the via hole 131. In practical applications, the number of the via holes 131 provided on the first spacers 130 is not limited to one in the above-mentioned embodiment, and two or more via holes may be provided. The via holes 131 may be arranged continuously or arranged at intervals on the first spacer 130.

Figure 6:
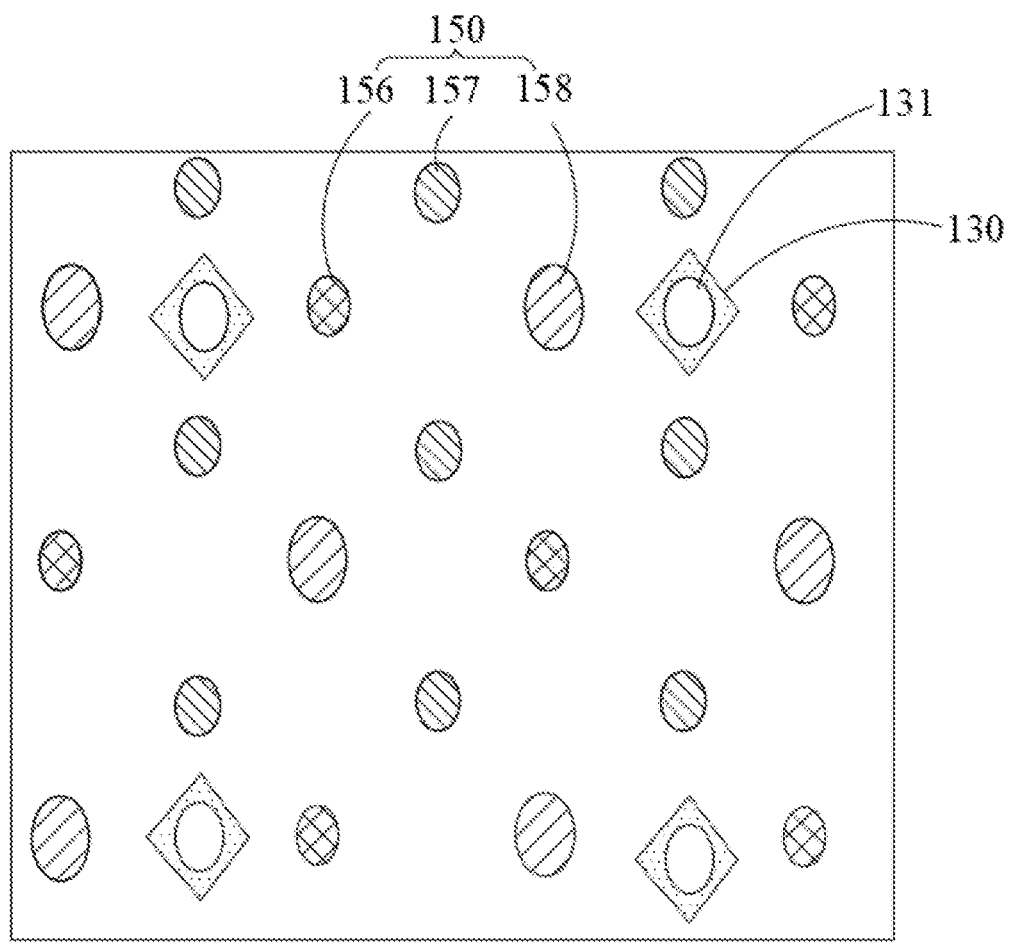
FIG. 6 is a schematic planar structural diagram of a first type of a first display region provided by an embodiment of the present application.

As shown in FIG. 2 and FIG. 6, FIG. 6 is a schematic planar structural diagram of a first type of a first display region provided by an embodiment of the present application. A plurality of first sub-pixel units 150 are disposed in the first display region 101, and each of the first spacers 130 is arranged between the plurality of first sub-pixel units 150. Each of the first sub-pixel units 150 includes an anode 151, an organic light-emitting layer 152, and a cathode layer 153. The anode 151 is disposed on a side of the pixel definition layer 120 close to the base 110. A plurality of first sub-pixel openings 121 provided on the pixel definition layer 120 expose the anode 151. The organic light-emitting layer 152 is disposed in the first sub-pixel opening 121 and is located on a side of the anode 151 away from the base 110. The cathode layer 153 is formed by a full surface evaporation process, and the cathode layer 153 covers the pixel definition layer 120 and the organic light-emitting layer 152.

It should be noted that an adhesive force between the first cathode suppression layer 140 and the cathode layer 153 is small, or even the first cathode suppression layer 140 and the cathode layer 153 repel each other. When the cathode layer 153 is formed by the full surface evaporation process, an adhesive force between the cathode layer 153 and the other film layers is greater than the adhesive force between the first cathode suppression layer 140 and the cathode layer 153, so that no cathode layer is deposited in the via hole 131 of each of the first spacers 130 or the thickness of the cathode layer deposited in the via hole is relative thin. In this way, a light transmittance of the first spacers to visible light and near-infrared light is greatly increased, and an overall light transmittance of the first display region 101 is increased without changing the manufacturing process of the cathode layer 153. Therefore, the optical elements disposed under the display panel 100 corresponding to the first display region 101 can receive sufficient light signals.

In one embodiment, the material of the first cathode suppression layer 140 may include at least one of Balq (Bis(2-methyl-8-quinolinolate)-4-(phenylphenolato)aluminium), TAZ (3-(Biphenyl-4-yl)-5-(4-tert-butylphenyl)-4-phenyl-4H-1,2,4-triazole), and Indium Oxide, and the material of the cathode layer 153 is magnesium. Magnesium has a poor adhesive force to Balq, TAZ, and Indium Oxide. When magnesium is evaporated to form the cathode layer 153, the first cathode suppression layer 140 can suppress magnesium from being formed on the first cathode suppression layer 140.

In one embodiment, each of first sub-pixel units 150 includes a first red sub-pixel unit 156, a first green sub-pixel unit 157, and a first blue sub-pixel unit 158. The first red sub-pixel unit 156, the first green sub-pixel unit 157, and the first blue sub-pixel unit 158 may have a circular shape or an oval shape, so that the spacing between the plurality of first sub-pixel units 150 is sufficient to place the first spacer 130.

The plurality of first red sub-pixel unit 156, the plurality of first green sub-pixel units 157, and the plurality of first blue sub-pixel units 158 are arranged in the first display region 101 at intervals according to a certain rule. Each of the first spacer 130 is arranged in the middle of a matrix formed by one first red sub-pixel unit 156, one blue sub-pixel unit 158 and two opposite first green sub-pixel units 157.

It should be noted that, in the embodiment of the present application, every eight first sub-pixel units 150 share one first spacer 130. In practical applications, it is not necessary to provide first spacers 130 between all the first sub-pixel units 150. The number and the location of the first spacers 130 may be arranged according to actual needs, and no specific limitations are made here.

In one embodiment, the via hole 131 penetrates at least the first spacer 130 in a thickness direction of the display panel 100.

As shown in FIG. 2, the via hole 131 penetrates the first spacer 130 and exposes the pixel definition layer 120 under the first spacer 130. Th display panel 100 further includes a first auxiliary layer 154 and a second auxiliary layer 155. Both the first auxiliary layer 154 and the second auxiliary layer 155 are formed by a full surface evaporation process. While covering the anode 151 and the pixel definition layer 120, the first auxiliary layer 154 is deposited and formed on the pixel definition layer 120 exposed by the via hole 130. While covering the organic light-emitting layer 152 and the first auxiliary layer 154, the second auxiliary layer 155 is deposited and formed on the first auxiliary layer 154 located in the via hole 131. In this way, the first auxiliary layer 154, the second auxiliary layer 155, and the first cathode suppression layer 140 are formed in the via hole 131 and are sequentially stacked in a direction away from the base 110.

Specifically, the first auxiliary layer 154 includes an electron-hole injection layer and an electron-hole transmission layer that are sequentially stacked in a direction away from the base 110, and the electron-hole injection layer covers the anode 151. The second auxiliary layer 155 includes an electron transmission layer and an electron injection layer sequentially stacked in a direction away from the base 110, and the electron transmission layer covers the organic light-emitting layer 152.

Furthermore, as shown in FIG. 2, a filling layer 160 made of a light-transmitting material is further disposed in the via hole 131, and the filling layer 160 is disposed on a side of the first cathode suppression layer 140 away from the base 110.

Specifically, the first auxiliary layer 154, the second auxiliary layer 155 and the first cathode suppression layer 140 are sequentially formed on the pixel definition layer 120 exposed by the via hole 131, and the filling layer 160 is formed on the first cathode suppression layer 140. It can be understood that when the depth of the via hole 131 is large, the first auxiliary layer 154, the second auxiliary layer 155, and the first cathode suppression layer 140 cannot fill the via hole 131, and there still be a recessed portion on a surface of the first spacer 130 away from the base 110. This may affect the encapsulation performance of an encapsulation layer formed in the subsequent manufacturing process and may lead to encapsulation failure of the encapsulation layer. Using the filling layer 160 to fill in the via hole 131 can reduce the degree of depression of the recessed portion on the surface of the first spacer 130 away from the base 110 and improve the flatness of the surface of the first spacer 130 away from the base 110, thereby reducing the encapsulation failure risk of the encapsulation layer.

Preferably, a surface of the filling layer 160 away from the base 110 is flush with a surface of the first spacers 130 away from the base 110. In this way, the via hole 131 is filled by the filling layer 160 so that there is no recessed portion on the surface of the first spacers 130 away from the base 110. That is beneficial to forming of the encapsulation layer, thereby reducing the encapsulation failure risk of the encapsulation layer.

Figure 3:
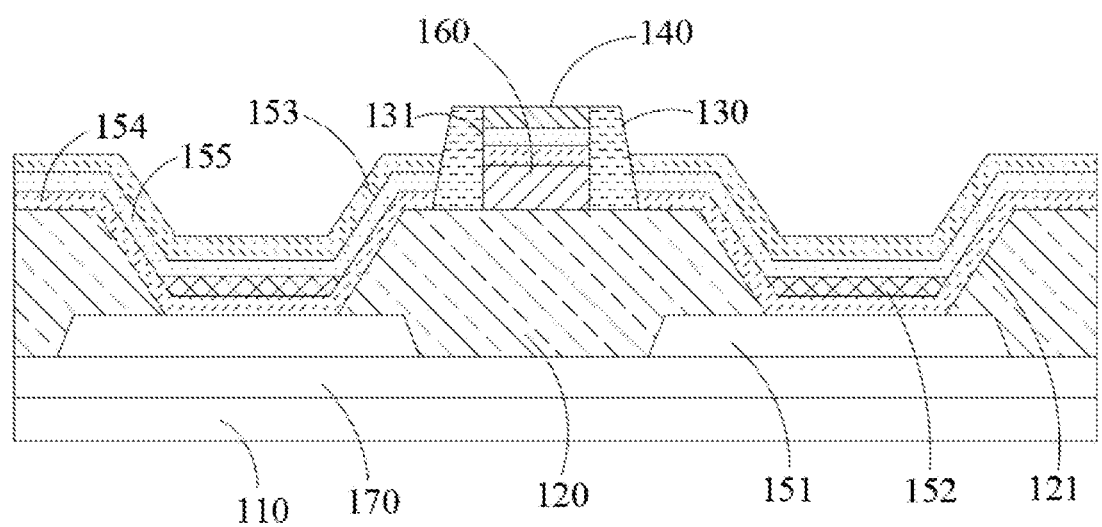
FIG. 3 is a schematic structural diagram of a second type of the display panel provided by an embodiment of the present application.

In one embodiment, as shown in FIG. 3, which is a schematic structural diagram of a second type of the display panel provided by an embodiment of the present application, the structure of the second type of the display panel shown in FIG. 3 is roughly the same as the structure of the first type of the display panel shown in FIG. 2, except that: the filling layer 160 in the second type of the display panel shown in FIG. 3 is disposed on a side of the first cathode suppression layer 140 close to the base 110.

Specifically, the filling layer 160 is formed on the pixel definition layer 120 exposed by the via hole 130, and the first auxiliary layer 154, the second auxiliary layer 155, and the first cathode suppression layer 140 are sequentially formed on the filling layer 160. In the manufacturing process, the filling layer 160 is formed first, and then the first auxiliary layer 154, the second auxiliary layer 155, and the first cathode suppression layer 140 are sequentially formed on the filling layer 160. Similarly, the same technical effect as the second type of the display panel shown in FIG. 2 can be obtained, and the detail will not be described here.

Furthermore, in order to ensure the encapsulation effect of the encapsulation layer, a surface of the first cathode suppression layer 140 away from the base 110 is flush with a surface of the first spacers 130 away from the base 110.

Figure 4:
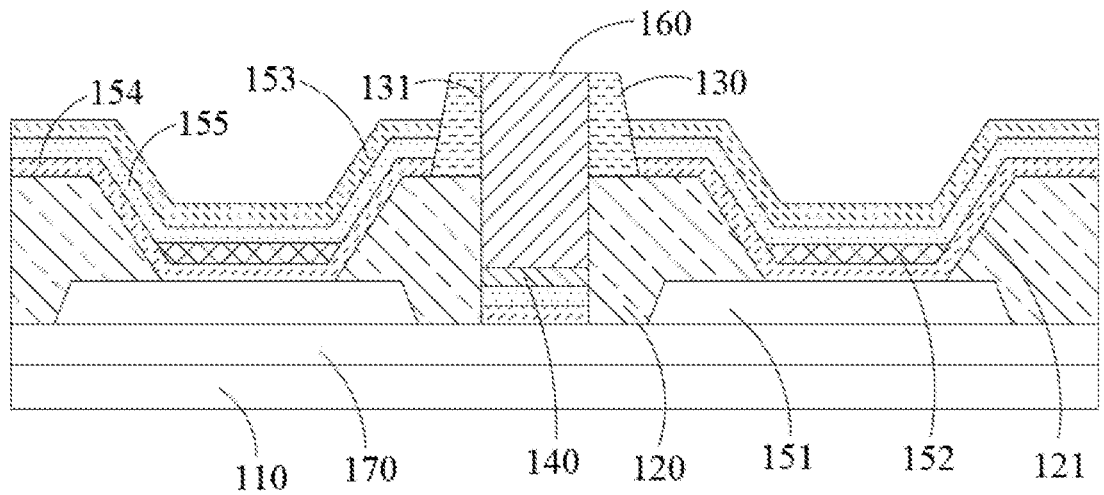
FIG. 4 is a schematic structural diagram of a third type of the display panel provided by an embodiment of the present application.

In one embodiment, as shown in FIG. 4, which is a schematic structural diagram of a third type of the display panel provided by an embodiment of the present application, the structure of the third type of the display panel shown in FIG. 4 is roughly the same as the structure of the first type of the display panel shown in FIG. 2, except that: the via hole 131 penetrates the first spacer 130 and the pixel definition layer 120, in the third type of the display panel shown in FIG. 4.

Specifically, the display panel 100 further includes a thin film transistor array layer 170 disposed between the pixel definition layer 120 and the base 110. The film transistor array layer 170 includes a planarization layer close to the pixel definition layer 120. The via hole 131 penetrates the first spacer 130 and the pixel definition layer 120 and exposes the planarization layer. The first auxiliary layer 154, the second auxiliary layer 155, and the first cathode suppression layer 140 are sequentially formed on the planarization layer exposed by the via hole 131. The filling layer 160 is formed on the first cathode suppression layer 140. In order to ensure the encapsulation effect of the third type of the display panel shown in FIG. 4, a surface of the filling layer 160 away from the base 110 is flush with a surface of the first spacers 130 away from the base 110.

Figure 5:
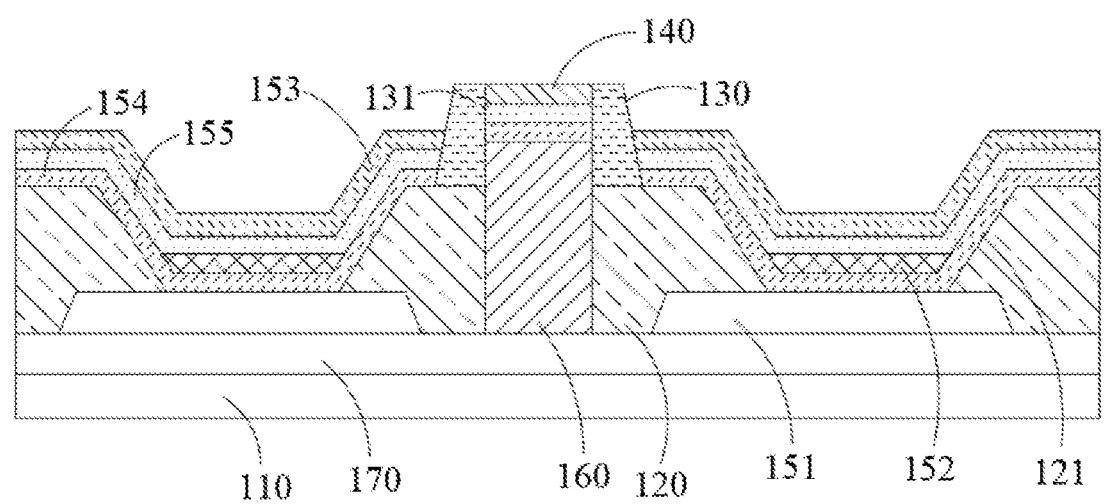
FIG. 5 is a schematic structural diagram of a fourth type of the display panel provided by an embodiment of the present application.

In one embodiment, as shown in FIG. 5, which is a schematic structural diagram of a fourth type of the display panel provided by an embodiment of the present application, the structure of the fourth type of the display panel shown in FIG. 5 is roughly the same as the structure of the third type of the display panel shown in FIG. 4, except that: the filling layer 160 is disposed on a side of the first cathode suppression layer 140 close to the base 110, in the fourth type of the display panel shown in FIG. 5.

Specifically, the filling layer 160 is formed on the planarization layer exposed by the via hole 131. The first auxiliary layer 154, the second auxiliary layer 155, and the first cathode suppression layer 140 are sequentially formed on the filling layer 160, in order to ensure the encapsulation effect of the fourth type of the display panel shown in FIG. 5.

In one embodiment, with reference to FIG. 2 and FIG. 6, on a plane where a surface of the first spacers 130 away from the base 110 is located, a ratio of an opening area of the via hole 131 to an area of an end of the first spacer 130 away from the base 110 is 0.7.

It can be understood that the main function of the first spacer 130 is to support the mask. The ratio of the opening area of the via hole 131 to the area of the end of the first spacer 130 away from the base 110 may be 0.7, so that the opening area of the via hole 131 is large enough, and the first spacer 130 with sufficient support performance can be ensured, moreover. In practical application, the ratio of the opening area of the via hole 131 to the area of the end of the first spacer 130 away from the base 110 may not be limited to 0.7, and may also be 0.5, 0.6, 0.8 or 0.9, etc. The ratio only needs to be between 0.5 and 0.9.

Specifically, on the plane where the surface of the first spacers 130 away from the base 110 is located, the planar shape of each of the first spacers 130 is a square. The length of each of sides of the first spacers is 40 micrometers, and the area of the first spacer 130 is 1600 square micrometers. The opening shape of the via hole 131 is circular, and the area of the via hole 131 is 1120 square micrometers. In practical applications, the length of each of sides of the first spacers 131 may not be limited to 40 micrometers, and may also be 30 micrometers, 35 micrometers, etc. The length only needs to be between 30 micrometers and 40 micrometers.

Figure 7:
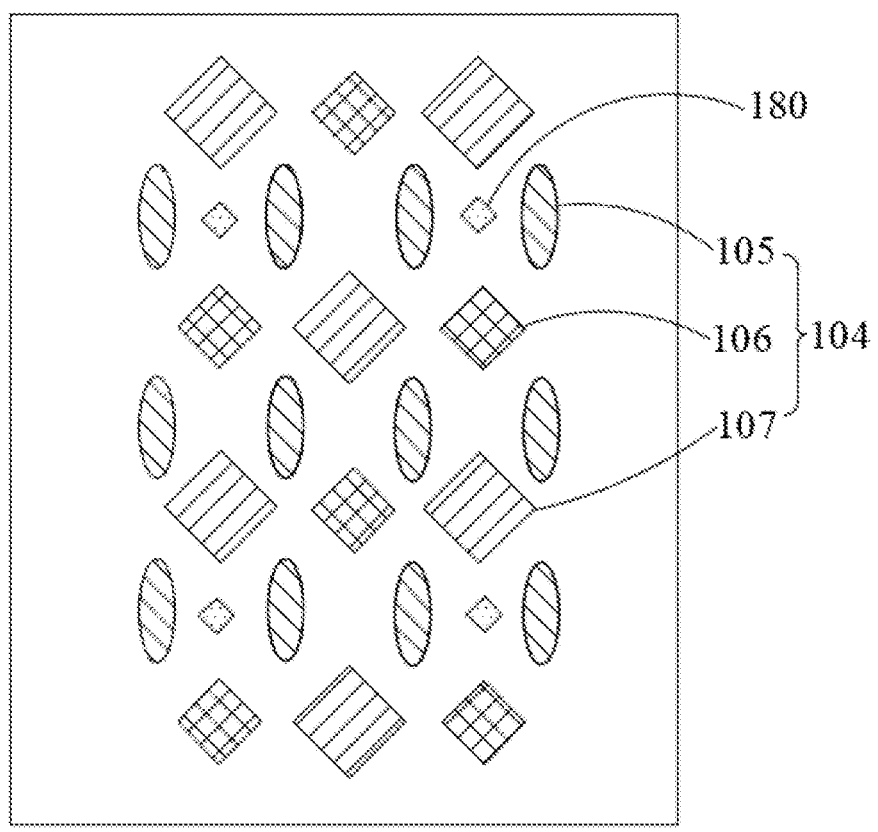
FIG. 7 is a schematic planar structural diagram of a second display region provided by an embodiment of the present application.

In one embodiment, as shown in FIG. 7, which is a schematic planar structural diagram of a second display region provided by an embodiment of the present application, the display panel 100 further includes a plurality of second spacers 180. The plurality of second spacers 180 are arranged at intervals between the plurality of the sub-pixel units in the second display region, and each of the second spacers 180 and each of the first spacers 130 are disposed on the same side of the pixel definition layer 120.

In one embodiment, each of the second sub-pixel units 104 includes a second green sub-pixel unit 105, a second red sub-pixel 106, and a second blue sub-pixel unit 107. The planar shape of the second green sub-pixel unit 105 is an ellipse, and the planar shape of the second red sub-pixel unit 106 and the second blue sub-pixel unit 107 is a rectangle or a diamond. Each of the second spacer 180 is arranged in the middle of a matrix formed by two opposite second green sub-pixel units 105, one second red sub-pixel 106 and one blue sub-pixel unit 107.

A height of each of the first spacers 130 is equal to a height of each of the second spacer 180, and an area of an end of the first spacers 130 away from the base 110 is greater than an area of an end of the second spacers 180 away from the base 110.

It can be understood that the first spacer 130 has functions of transmitting light and supporting the mask, and the second spacer 180 only has a function of supporting the mask. By limiting the area of the end of the second spacer 180 away from the base 110 to be smaller than the area of the end of the first spacer 130 away from the base 110, the area occupied by the second spacer 180 of each of second sub-pixel units 104 in the second display region 102 can be reduced, thereby ensuring that the display performance of the second display region 102 is not affected.

Furthermore, a ratio of an area of the end of the second spacers 180 away from the base 110 to an area of the end of the first spacers 130 away from the base 110 is 0.14.

Specifically, the planar shape of each of the second spacers 180 is also a square. The length of each of sides of the second spacers 180 is 15 micrometers, and the area of the second spacers 180 is 225 square micrometers. In practical application, the ratio of the area of the end of the second spacers 180 away from the base 110 to the area of the end of the first spacers 130 away from the base 110 may not be limited to 0.14, and may also be 0.16, 0.2 or 0.25, etc. The ratio only needs to be between 0.14 and 0.25.

In one embodiment, as shown in FIG. 2, a minimum distance T1 between an orthographic projection of the via hole 131 projected on the base 110 and an orthographic projection of the anode 151 adjacent to the via hole 131 projected on the base 110 is 3 micrometers. It can be understood that due to the precision limitation of the manufacturing process, if the distance between the via hole 131 and the adjacent anode 151 is too small, the adjacent anode 151 may be exposed during the process of forming the via hole 131 by etching, thereby causing the deposited first cathode suppression layer 140 to contact the anode 151 and affecting the electrical performance of the anode 151. By limiting the distance T1 between the orthographic projection of the via hole 131 projected on the base 110 and the orthographic projection of the anode 151 adjacent to the via hole 131 projected on the base 110 to be 3 micrometers, it is possible to prevent the first cathode suppression layer 140 from contacting the anode 151, thereby maintaining the electrical performance of the anode 151.

In practical application, the distance between the orthographic projection of the via hole 131 projected on the base 110 and the orthographic projection of the anode 151 adjacent to the via hole 131 projected on the base 110 may not be limited to 3 micrometers, and may also be 2 micrometers, 4 micrometers or 5 micrometers, etc. The distance only needs to between 2 micrometers and 5 micrometers.

Figure 8:
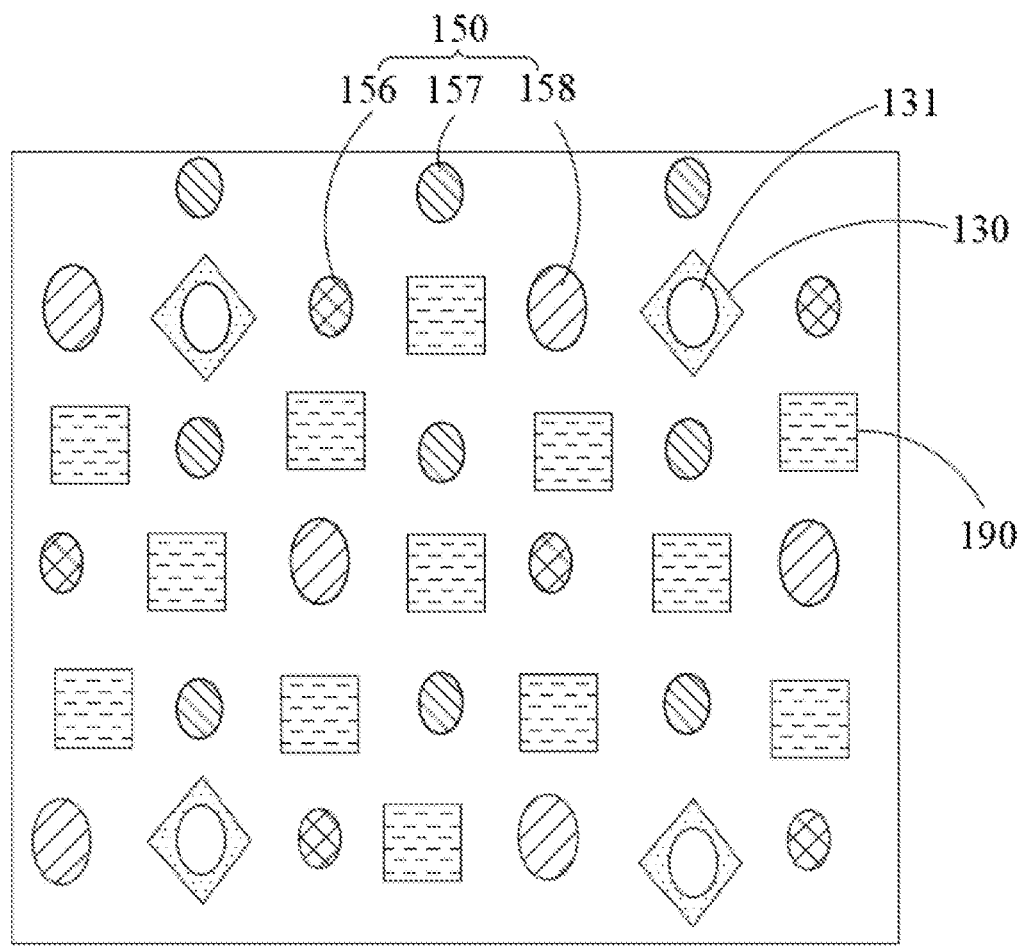
FIG. 8 is a schematic planar structural diagram of a second type of a first display region provided by an embodiment of the present application.
Figure 9:
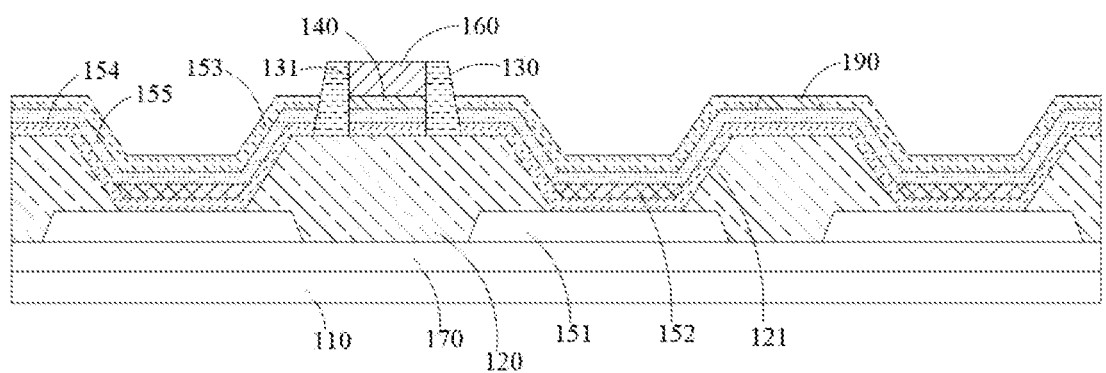
FIG. 9 is a schematic structural diagram of a fifth type of the display panel provided by an embodiment of the present application.

In one embodiment, as shown in FIG. 8 and FIG. 9, wherein FIG. 8 is a schematic planar structural diagram of a second type of a first display region provided by an embodiment of the present application, and FIG. 9 is a schematic structural diagram of a fifth type of the display panel provided by an embodiment of the present application. The display panel 100 further includes a plurality of second cathode suppression layers 190, wherein the plurality of second cathode suppression layers 190 are disposed on a portion of the pixel definition layer 120 corresponding to the first display region 101 and are located between the plurality of first sub-pixel units 150. An orthographic projection of the first cathode suppression layer 140 projected on the base 110 is separated from an orthographic projection of the second cathode suppression layers 190 projected on the base 110.

Specifically, the material of the second cathode suppression layer 190 is same as the material of the first cathode suppression layer 140. Because the second cathode suppression layer 190 with low adhesive force or even repeals to the cathode layer are disposed between the plurality of the first sub-pixel units 150 in the first display region, once the cathode layer is formed by the full surface evaporation process, the thickness of the cathode layer deposited on the second cathode suppression layer 190 is relative thin or there is no cathode layer deposited on the second cathode suppression layer 190. In this way, a light transmittance between the plurality of first sub-pixel units 150 in the first display region 101 is increased without changing the manufacturing process of the cathode layer, so that the overall light transmittance of the first display region 101 is further increased.

Furthermore, the orthographic projection of the first cathode suppression layer 140 projected on the base 110 and the orthographic projection of the second cathode suppression layers 190 projected on the base 110 are both separated from the orthographic projection of the anode 151 projected on the base 110.

It should be note that the orthographic projection of the anode 151 projected on the base 110 will cover the orthographic projection of the first sub-pixel opening 121 projected on the base 110. In order to ensure that each of the sub-pixel units in the first display region 101 display normally, it is necessary to ensure that the orthographic projection of the cathode layer projected on the base 110 covers the orthographic projection of the first sub-pixel opening 121 projected on the base 110. By arranging the first cathode suppression layer 140 and the second cathode suppression layer 190 not to overlap with the anode 151, it can be ensured that the first cathode suppression layer 140 and the second cathode suppression layer 190 are kept at a certain distance from the first sub-pixel opening 121. Moreover, it may be ensured that the orthographic projection of the cathode layer 153 projected on the base 110 covers the orthographic projection of the first sub-pixel opening 121 projected on the base 110 to prevent the first display region 101 from interferences and adverse effects caused by the arrangement of the first cathode suppression layer 140 and the second cathode suppression layer 190.

Furthermore, a thickness of the first cathode suppression layer 140 and a thickness of the second cathode suppression layers 190 are both less than or equal to a thickness of the cathode layer 153.

Specifically, the first cathode suppression layer 140 and the second cathode suppression layer 190 have the same thickness and are formed by using the same fine mask through the same evaporation process. It is understood that the first cathode suppression layer 140 and the second cathode suppression layer 190 can prevent the cathode layer 153 from being deposited thereon. By limiting the thickness of the first cathode suppression layer 140 and the thickness of the second cathode suppression layer 190 to be less than or equal to the thickness of the cathode layer 153, it can prevent the cathode layer 153, the first cathode suppression layer 140, and the second cathode suppression layer 190 from generating a large film layer difference, thereby ensuring that the encapsulation performance of an encapsulation layer of the display panel 100 is not affected.

In one embodiment, on a plane where a surface of the second cathode suppression layer 190 away from the base 110, the shape of the second cathode suppression layer 190 may be a rectangle as shown in FIG. 8, or other shapes such as polygon, circle, ellipse. The shape of the second cathode suppression layer 190 can be set according to requirements, and there is no limitation here.

The embodiment of the present application further provides a display device. The display device includes a device main body and a display panel. The device main body includes a housing, a power supply module, a processor module, a camera module, etc., and the display panel is disposed on the device main body. The display panel may be the display panel provided in the above-mentioned embodiment, and the display panel in the display device provided in the embodiment of the present application can achieve the same technical effect as the display panel provided in the above-mentioned embodiment, which will not be described here.

Figure 10:
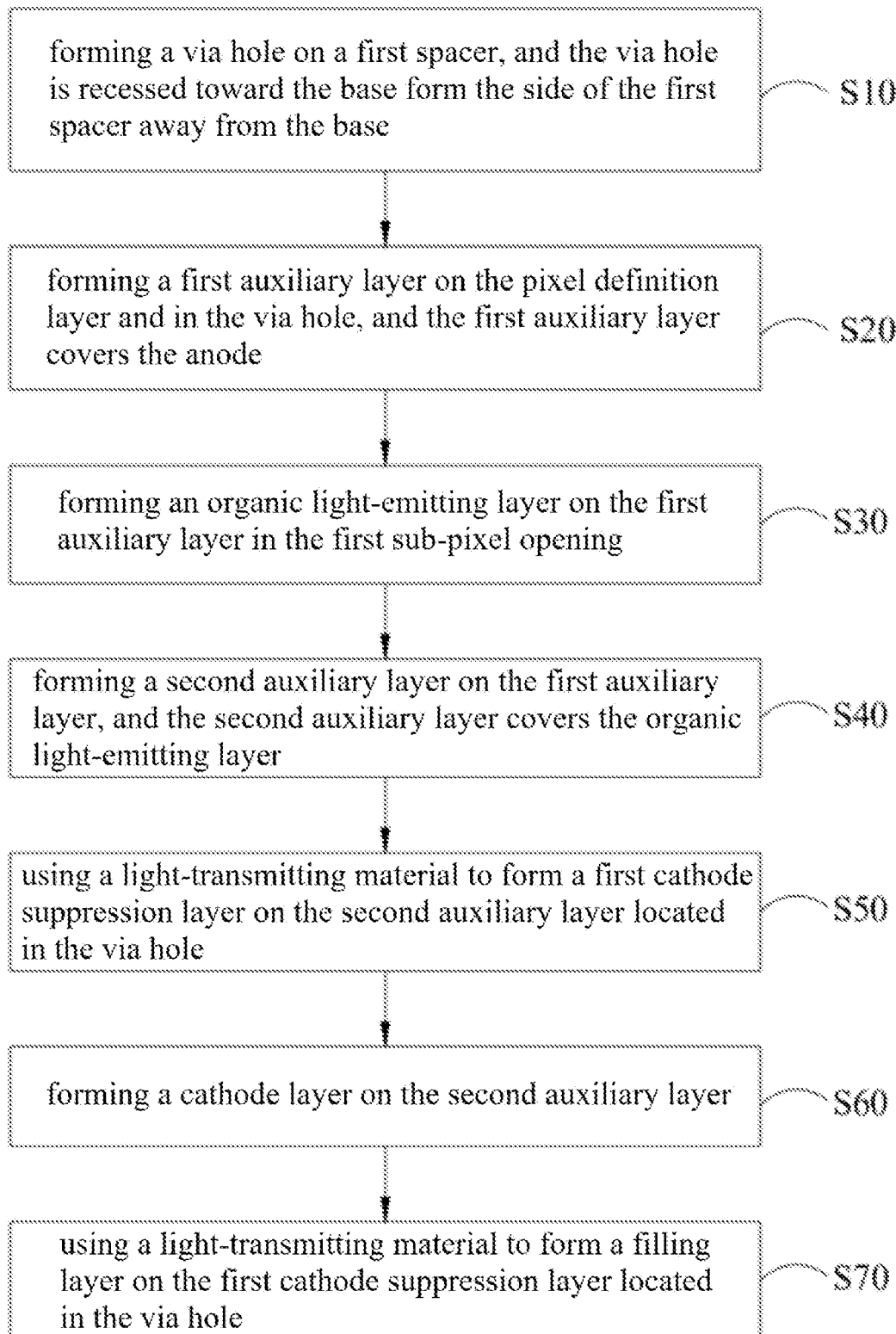
FIG. 10 is a flowchart of a manufacturing method of a display panel provided by an embodiment of the application.

The embodiment of the present application further provides a manufacturing method of a display panel. The detail description of this embodiment refers to FIG. 1 to FIG. 10, wherein FIG. 10 is a flowchart of a manufacturing method of a display panel provided by an embodiment of the application.

The display panel 100 includes a first display region 101 and a second display region 102, wherein the display panel 100 includes a base 110, a pixel definition layer 120 disposed on a side of the base 110, and a plurality of first spacers 130. The plurality of first spacers 130 are arranged in the first display region 101 at intervals and are disposed on a side of the pixel definition layer 120 away from the base 110. A plurality of first sub-pixel openings 121 located in the first display region 101 are provided on the pixel definition layer 120. The plurality of first sub-pixel openings 121 expose the anode 151 under the pixel definition layer 120.

The manufacturing method of a display panel includes steps of:

Step S10: forming a via hole 131 on a first spacer 130, and the via hole 131 is recessed toward the base 110 form the side of the first spacer 130 away from the base 110.

Step S20: forming a first auxiliary layer 154 on the pixel definition layer 120 and in the via hole 131, and the first auxiliary layer 154 covers the anode 151.

Step S30: forming an organic light-emitting layer 152 on the first auxiliary layer 154 in the first sub-pixel opening 121.

Step S40: forming a second auxiliary layer 155 on the first auxiliary layer 154, and the second auxiliary layer 155 covers the organic light-emitting layer 152.

Step S50: using a light-transmitting material to form a first cathode suppression layer 140 on the second auxiliary layer 155 located in the via hole 131.

Step S60: forming a cathode layer on the second auxiliary layer 155.

Step S70: using a light-transmitting material to form a filling layer 160 on the first cathode suppression layer 140 located in the via hole 131.

In one embodiment, a distance between an orthographic projection of the via hole 131 projected on the base 110 and an orthographic projection of the anode 151 adjacent to the via hole 131 projected on the base 110 is greater or equal to 2 micrometers and less than or equal to 5 micrometers.

In one embodiment, in the step S10, a photolithography process is used to form the via hole 131 on the first spacer 130.

In one embodiment, a same common mask is used in the step S20, the step S40, and the step S60, to respectively form the first auxiliary layer 154, the second auxiliary layer 155, and the cathode layer through a full surface evaporation process.

In one embodiment, in the step S30, a first fine metal mask is used to form the organic light-emitting layer 152 in the first sub-pixel opening 121 and the second sub-pixel opening 122.

In one embodiment, in the step S50, a second fine metal mask is used to form the first cathode suppression layer 140 on the second auxiliary layer 155 in the via hole 131.

In one embodiment, in the step S50, a second fine metal mask is used to form the first cathode suppression layer 140 on the second auxiliary layer 155 in the via hole 131 and to form the second cathode suppression layer 190 between the plurality of first sub-pixel units 150 in the first display panel.

In one embodiment, the orthographic projection of the first cathode suppression layer 140 projected on the base 110 and the orthographic projection of the second cathode suppression layers 190 projected on the base 110 are both separated from the orthographic projection of the anode 151 projected on the base 110.

In one embodiment, the display panel 100 further includes a cathode layer 153 disposed on the side of the pixel definition layer 120 away from the base 110, wherein a thickness of the first cathode suppression layer 140 and a thickness of the second cathode suppression layers 190 are both less than or equal to a thickness of the cathode layer 153.

In one embodiment, a plurality of second spacers 180 are disposed in the second display region 102, and a height of each of the first spacers 130 is equal to a height of each of the second spacer 180, a ratio of an area of the end of the second spacers 130 away from the base 110 to an area of the end of the first spacers 130 away from the base 110 is greater than or equal to 0.14 and less than or equal to 0.25.

In one embodiment, on a plane where a surface of the first spacers 130 away from the base 110 is located, a ratio of an opening area of the via hole 131 to an area of an end of the first spacer 130 away from the base 110 is greater than or equal to 0.5 and less than or equal to 0.9.

In one embodiment, the via hole 131 penetrates at least the first spacer 130 in a thickness direction of the display panel 100.

In one embodiment, the via hole 131 penetrates the first spacer 130 and the pixel definition layer 120.

In one embodiment, the step S70 may be performed before the step S20, that is, the filling layer 160 is formed with a light-transmitting material in the via hole 131 first, and then the steps S20 to S60 are performed. The first auxiliary layer 154, the second auxiliary layer 155, and the first cathode suppression layer 140 are sequentially formed on the filling layer 160.

Specifically, the first auxiliary layer 154 includes an electron-hole injection layer and an electron-hole transmission layer that are sequentially stacked in a direction away from the base 110, and the electron-hole injection layer covers the anode 151. The second auxiliary layer 155 includes an electron transmission layer and an electron injection layer sequentially stacked in a direction away from the base 110, and the electron transmission layer covers the organic light-emitting layer 152.

In view of the above, a display panel, a manufacturing method of a display panel, and a display device are provided in the embodiments of the present application. The display panel having a first display region and a second display region, and the display panel includes a base, a pixel definition layer, and a plurality of first spacers. The pixel definition layer is disposed on a side of the base. The plurality of first spacers are arranged in the first display region at intervals, and are disposed on a side of the pixel definition layer away from the base. At least one of the first spacers is provided with a via hole, and the via hole are formed by recessing from a side of each of the first spacers away from the base toward the base. A first cathode suppression layer made of a light-transmitting material is disposed in the via hole. When a cathode layer is formed by a full surface evaporation process, the first cathode suppression layer can cause that no cathode layer is deposited in the via hole of each of the first spacers. In this way, the light transmittance of each of the first spacers in the first display region is increased, and the light transmittance of the first display region is increased.

In view of the above, although the present invention has been disclosed by way of preferred embodiments, the above preferred embodiments are not intended to limit the present invention, and one of ordinary skill in the art, without departing from the spirit and scope of the invention, the scope of protection of the present invention is defined by the scope of the claims.

What is claimed is:

1. A display panel having a first display region, the display panel comprising:
    a base;
    a pixel definition layer disposed on a side of the base; and
    a plurality of first spacers arranged in the first display region at intervals, and disposed on a side of the pixel definition layer away from the base;
    wherein at least one of the first spacers is provided with a via hole, and a first cathode suppression layer made of a light-transmitting material is disposed in the via hole;
    wherein the via hole penetrates the first spacer and the pixel definition layer in a thickness direction of the display panel.

2. The display panel according to claim 1, wherein a filling layer made of a light-transmitting material is further disposed in the via hole, and the filling layer is disposed on a side of the first cathode suppression layer away from the base.

3. The display panel according to claim 2, wherein a surface of the filling layer away from the base is flush with a surface of the first spacer away from the base.

4. The display panel according to claim 1, wherein a filling layer made of a light-transmitting material is further disposed in the via hole, and the filling layer is disposed on a side of the first cathode suppression layer close to the base.

5. The display panel according to claim 4, wherein a surface of the first cathode suppression layer away from the base is flush with a surface of the first spacer away from the base.

6. The display panel according to claim 1, wherein, on a plane where a surface of the at least one of the first spacers away from the base is located, a ratio of an opening area of the via hole to an area of an end of the first spacer away from the base is greater than or equal to 0.5 and less than or equal to 0.9.

7. The display panel according to claim 1, further comprising a second display region, and a plurality of second spacers arranged in the second display region at intervals, wherein each of the second spacers and each of the first spacers are disposed on the same side of the pixel definition layer;
    wherein an area of an end of the first spacer away from the base is greater than an area of an end of the second spacer away from the base.

8. The display panel according to claim 7, wherein a ratio of an area of the end of the second spacer away from the base to an area of the end of the first spacer away from the base is greater than or equal to 0.14 and less than or equal to 0.25.

9. The display panel according to claim 1, wherein a plurality of sub-pixel units are disposed in the first display region in array, the at least one of the first spacers is arranged between the plurality of sub-pixel units, each of the sub-pixel units comprises an anode, and the anode is disposed on a side of the pixel definition layer close to the base;
    wherein a minimum distance between an orthographic projection of the via hole projected on the base and an orthographic projection of the anode adjacent to the via hole projected on the base is greater or equal to 2 micrometers and less than or equal to 5 micrometers.

10. The display panel according to claim 9, further comprising a plurality of second cathode suppression layers, wherein the plurality of second cathode suppression layers are disposed on a portion of the pixel definition layer corresponding to the first display region, and are located between the plurality of sub-pixel units;
    wherein an orthographic projection of the first cathode suppression layer projected on the base is separated from an orthographic projection of the second cathode suppression layers projected on the base.

11. The display panel according to claim 10, wherein the orthographic projection of the first cathode suppression layer projected on the base and the orthographic projection of the second cathode suppression layers projected on the base are both separated from the orthographic projection of the anode projected on the base.

12. The display panel according to claim 10, further comprising a cathode layer disposed on the side of the pixel definition layer away from the base, wherein a thickness of the first cathode suppression layer and a thickness of the second cathode suppression layers are both less than or equal to a thickness of the cathode layer.

13. A display device comprising a display panel, the display panel having a first display region, the display panel comprising:
    a base;
    a pixel definition layer disposed on a side of the base; and a plurality of first spacers arranged in the first display region at intervals, and disposed on a side of the pixel definition layer away from the base;

wherein at least one of the first spacers is provided with a via hole, and a first cathode suppression layer made of a light-transmitting material is disposed in the via hole;

wherein the via hole penetrates the first spacer and the pixel definition layer in a thickness direction of the display panel.

14. The display device according to claim 13, wherein a filling layer made of a light-transmitting material is further disposed in the via hole, and the filling layer is disposed on a side of the first cathode suppression layer away from the base.

15. The display device according to claim 14, wherein a surface of the filling layer away from the base is flush with a surface of the first spacer away from the base.

16. The display device according to claim 13, wherein a filling layer made of a light-transmitting material is further disposed in the via hole, and the filling layer is disposed on a side of the first cathode suppression layer close to the base.

\* \* \* \* \*